United States Patent
Ginty et al.

(10) Patent No.: US 10,481,992 B1
(45) Date of Patent: Nov. 19, 2019

(54) OPTIMIZATION OF FLASH STORAGE

(75) Inventors: Anthony Ginty, Douglas (IE); Cline W. Frasier, Vancouver, WA (US); Conor Ryan, Limerick (IE); Joseph Sullivan, Shannon (IE)

(73) Assignee: EMC IP Holding Company LLC, Hopkinton, MA (US)

( * ) Notice: Subject to any disclaimer, the term of this patent is extended or adjusted under 35 U.S.C. 154(b) by 1926 days.

(21) Appl. No.: 13/077,595

(22) Filed: Mar. 31, 2011

(51) Int. Cl.
 *G06F 12/00* (2006.01)
 *G06F 11/30* (2006.01)
 *G06F 3/06* (2006.01)
 G06F 13/00 (2006.01)
 G06F 13/28 (2006.01)

(52) U.S. Cl.
 CPC ........ *G06F 11/3058* (2013.01); *G06F 3/0604* (2013.01); *G06F 3/0634* (2013.01); *G06F 3/0679* (2013.01)

(58) Field of Classification Search
 CPC .. G06F 11/3058; G06F 3/0604; G06F 3/0634; G06F 3/0679
 USPC .............. 711/103, 170; 365/185.33; 702/186
 See application file for complete search history.

(56) References Cited

U.S. PATENT DOCUMENTS

| | | | | |
|---|---|---|---|---|
| 4,862,347 A * | 8/1989 | Rudy | | 703/14 |
| 5,402,380 A * | 3/1995 | Kumakura et al. | | 365/185.08 |
| 5,970,487 A * | 10/1999 | Shackleford et al. | | |
| 6,430,676 B1 * | 8/2002 | Koblenz | | G06F 8/4451 712/207 |
| 6,757,667 B1 * | 6/2004 | Patel | | G06Q 10/04 706/19 |
| 7,925,936 B1 * | 4/2011 | Sommer | | G11C 11/5628 714/704 |
| 2006/0253644 A1 * | 11/2006 | Surico et al. | | 711/103 |
| 2007/0033356 A1 * | 2/2007 | Erlikhman | | 711/162 |
| 2009/0307636 A1 * | 12/2009 | Cases | | G06F 17/505 716/132 |
| 2012/0239868 A1 * | 9/2012 | Ryan et al. | | 711/103 |
| 2012/0239991 A1 * | 9/2012 | Melik-Martirosian | | 714/708 |

* cited by examiner

*Primary Examiner* — Mark A Giardino, Jr.
(74) *Attorney, Agent, or Firm* — Krishnendu Gupta; Deepika Bhayana; Dorothy Chiang

(57) ABSTRACT

A method, system, and computer program product for increasing the life of a NAND flash, the method comprising selecting a set of internal control parameters for the NAND flash and optimizing the set of internal control parameters with a genetic algorithm to find an improved set of control parameters.

19 Claims, 16 Drawing Sheets

```
┌─────────────────────┐
│ DETERMINE VARIABLES │
│        1210         │
└─────────────────────┘

┌─────────────────────┐
│   CREATE OBJECT     │
│   WITH VARIABLES    │
│        1220         │
└─────────────────────┘

┌─────────────────────┐
│   CREATE GENETIC    │
│      ALGORITHM      │
│        1230         │
└─────────────────────┘
```

FIG. 12

OPTIMIZATION OF FLASH STORAGE

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This invention relates to data storage.

BACKGROUND

Computer data is vital to today's organizations. Enterprise storage systems are the type of storage systems that an enterprise uses to store data that needs a high level of availability and reliability. Commercial or consumer storage systems are those that are used by consumers or for general commercial use. In general, the requirements of an enterprise storage system, and differences from a consumer type system, can be expressed with respect to 4 attributes, Performance, Reliability, Durability, and Workload.

In general, the performance for an enterprise storage system needs to be the "best in class" under a given workload. Conversely, a consumer or commercial performance needs only be "good enough" for a particular application. Generally, an enterprise storage system needs a very low failure rate. In comparison, the failure rate for commercial or consumer memory is rarely tracked. With respect to durability, the enterprise system typically needs to withstand 5 years of use whereas a commercial system may require 3 years of use. Further, during those working conditions, the enterprise system must be available for 24 hours a day for seven days a week whereas a commercial system may only need to be available for 8 hours a day for 5 days a week.

In an effort to increase performance, both systems have begun to move to a storage type called flash which can provide higher reliability and quicker access times than traditional magnetic disk based storage. The quicker access times and higher reliability, due to no moving parts, comes at a cost of a fixed number of possible writes to the flash memory. In general, there are 2 types of flash memory, SLC flash and MLC flash. Both types of flash have much faster access rates than typical disk based hard drives. However, both types of flash are also more expensive. As well, both types of flash have a limited number of writes until they fail and are no longer usable for storage. For example, SLC flash may fail after approximately 100,000 writes where MLC flash may fail after a number of rights, for example 10,000 writes, which may be about ⅒ the number of writes as SLC. In addition, SLC flash can be written to about twice as fast as MLC flash and is about 3 times more expensive to produce.

SUMMARY

A method, system, and computer program product for increasing the life of a NAND flash, the method comprising selecting a set of internal control parameters for the NAND flash and optimizing the set of internal control parameters with a genetic algorithm to find an improved set of control parameters.

BRIEF DESCRIPTION OF THE DRAWINGS

Features and advantages of the present disclosure will become more apparent from the following detailed description of exemplary embodiments thereof taken in conjunction with the accompanying drawings in which:

FIG. 12 is a simplified illustration of a method of optimizing NAND variables, in accordance with an embodiment of the present invention;

DETAILED DESCRIPTION

Figure 1:
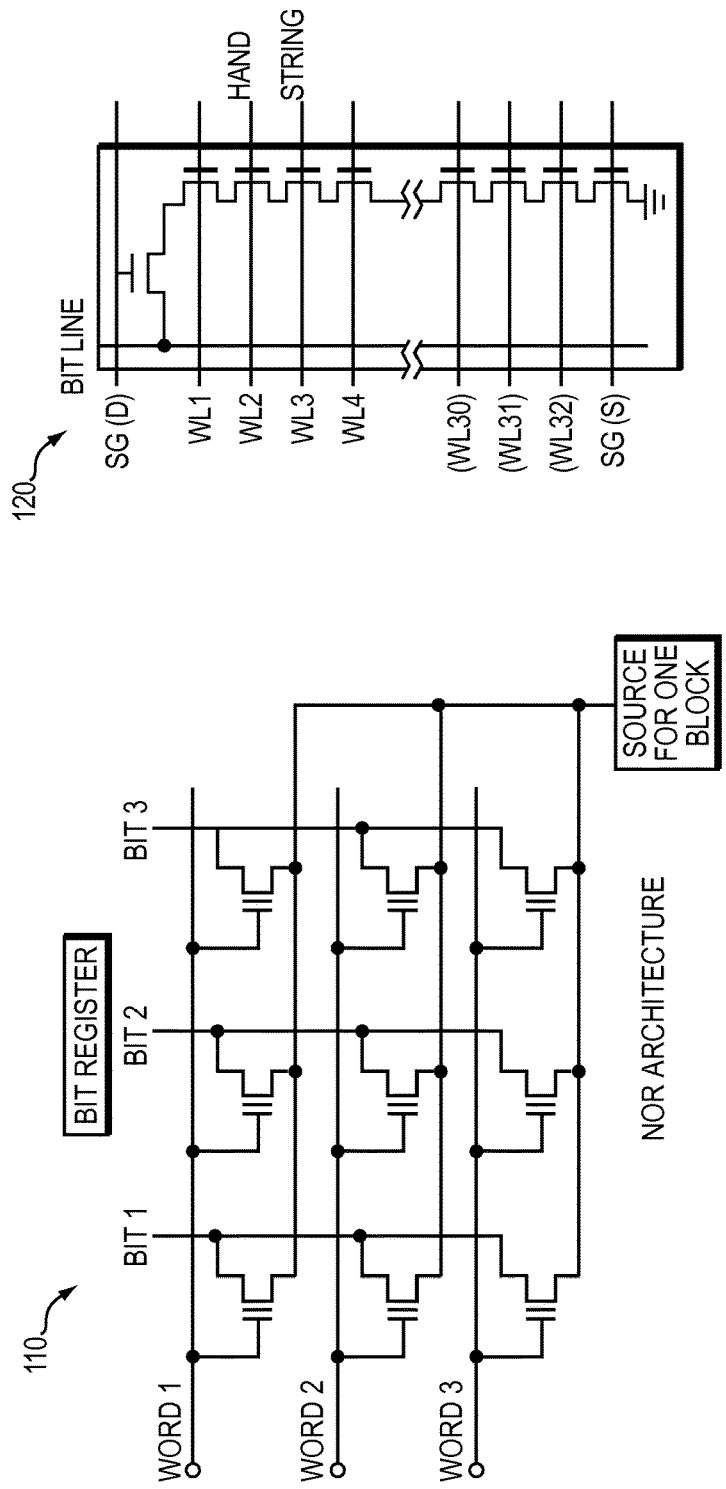
FIG. 1 is a simplified illustration of a NOR architecture and a NAND architecture, in accordance with an embodiment of the present invention.

In an embodiment, the current disclosure enables automatically discovering sets of optimal or near optimal internal register settings for NAND Flash using Genetic Algorithms. In some embodiments, Genetic Algorithms, as described herein, may be a form of Machine Learning coarsely based on the principles of Darwinian evolution. In certain embodiments, this technique may be applicable to both Single Level Cell (SLC) and Multi-Level Cell (MLC) Flash as well as other silicon & non-silicon based memory technologies.

The following terms may be helpful understanding the specification and claims:

Endurance May be the number of P/E cycles a memory device can withstand before the end of its life GA Genetic Algorithm MLC May be Multi Level Cell. More than one bit of information is stored in the memory element P/E Program Erase Page Each NAND block may consist of a number of pages that may share common programming and circuitry. Pages are typically 2,048, 4,096 or 8192 bytes in size. Reading and programming may be performed on a page basis. Associated with each page may be a few bytes that may be used for storage of an Error Correcting Code.

Persistent data May be data required to be held over a power cycle or permanently Recipe May be a set of register values that may control the operation of a NAND memory chip Recovery May be the phenomenon in which a failing cell, if given enough time may become functional again. Generally associated with electron trapping & detrapping phenomena.

Register May be a specialized memory location used to control some aspect of a silicon chip usually 8 bits in length, in NAND they are used primarily to control the operations of the device such as the read, write and erase conditions. These are proprietary & not available to general users Retention May be the ability of a memory device to retain memory settings while switched off Recipe May be a solution developed by the Genetic Algorithm, may also refer to a particular set of internal parameter settings for the FLASH Search Space May be the superset of all registers involved with controlling memory operations SLC May be single level cell. One bit of information is stored per memory element SSD May be a Solid State Drive Test Pattern May be the exact data loaded to a page of memory during testing Trimming May be an action of modifying registers in each single device based on some measurable quantity at manufacture time Flash Currently, Flash memory is being used more often to replace magnetic and other types of storage due to its speed, reliability and size. However, typical Flash systems have some drawbacks (e.g. limited write cycles) due to the way Flash functions. Generally, raw Flash can perform 3 basic types of operations: program, erase or read. Usually, the programming & erase operations are harsh on the Flash. Usually, this is because each program or erase operation typically subjects the Flash memory cells to a series of very high voltage, short duration pulses. Typically, each pulse adversely affects Flash cell operation due to charge trapping and other effects. Conventionally, it is the summation of these pulses over multiple program/erase operations that ultimately wears out the Flash. Usually, the Flash fails either because there are too many errors during a read operation or the program and erase voltages are no longer sufficient to modify the Flash cells.

Typically, raw Flash has many internal registers that control the programming, erase & read operations. Conventionally, the internal register settings or parameters, also commonly called the test mode information, are proprietary to the Flash manufacturer/vendor; they are set by the Flash vendor during the manufacturing & test process. In general, these internal settings or parameters cannot be seen or adjusted by the Flash user or customer. Typically, the internal register settings determine the voltage pulse levels, voltage pulse timings, number of pulses etc during the programming & erase operations. Generally, these values also determine the read levels.

Usually, these internal register settings not only control the programming, erase & read operations but they also directly impact the Flash's reliability characteristics: endurance & retention time. Typically, the endurance refers to the number of program/erase operations that can be performed before the Flash wears out; while the retention time refers to the amount of time that the flash can store or maintain its data. Typically, endurance & retention are inversely proportional i.e. higher endurance values can be attained with lower retention & vice versa.

Generally, setting of the endurance & retention values via the internal registers (test mode information) is complex. Typically, flash vendors use an endurance-retention specification which is suited for consumer applications. Conventionally, other applications may favor a different endurance-retention relationship but flash is not configured for the alternative configurations e.g. the optimum endurance-retention settings of an enterprise Flash drive are different to those demanded of consumer Flash. Currently, optimizing for different endurance-retention characteristics may be difficult because there are billions of possible permutations for the internal registers e.g. Current Flash memory chips typically have around thirty, 8-bit registers. Generally, if one were to test every possible combination of these, there would be approximately $8^{30}$ different possibilities—therefore, it is generally impracticable to optimize the internal registers over such a large space using conventional techniques.

Further, typical flash memory characteristics can vary due to variations in the silicon manufacturing process. Conventionally, this may be because the production of Flash may be done in a number of steps, with each step itself and within batches subject to different variance. Generally, variations also occur from wafer to wafer within a batch.

NAND and NOR Memory Architecture

Generally, the characteristics of NAND Flash are lower cost, high density, medium read speed, high write speed, high erase speed, and an indirect or I/O like access. Typically, the characteristics of NOR Flash are higher cost, lower density, high read speed, slow write speed, slow erase speed, and a random access interface.

NOR flash Memory is called NOR because its behavior closely resembles that of a NOR gate. The NOR gate is direct access memory i.e. each byte is accessible independently via an address bus. In general, the Execute in Place or (XIP) program code segment of the market is serviced by 'NOR' Non-Volatile memory (NVM). Typically, the data storage segment is serviced by 'NAND' NVM. NAND allows only sequential access to the data but can be made in larger arrays and has much reduced cost per bit.

Refer now to the example embodiment of FIG. 1. In FIG. 1, the NOR architecture 110 is characterized by a matrix arrangement with every bit accessible separately via an address bus. While the NAND architecture 120 is characterized by a string arrangement in which each bit is accessible only via other memory elements in the string.

Conventionally, sequential access is usually not a problem for data such as music or video since its natural form is sequential. Typically, NAND may be more densely packed since sequential access means that large sections of memory share read and write circuitry (a page) and an even larger section share an erase circuit (a block).

Figure 2:
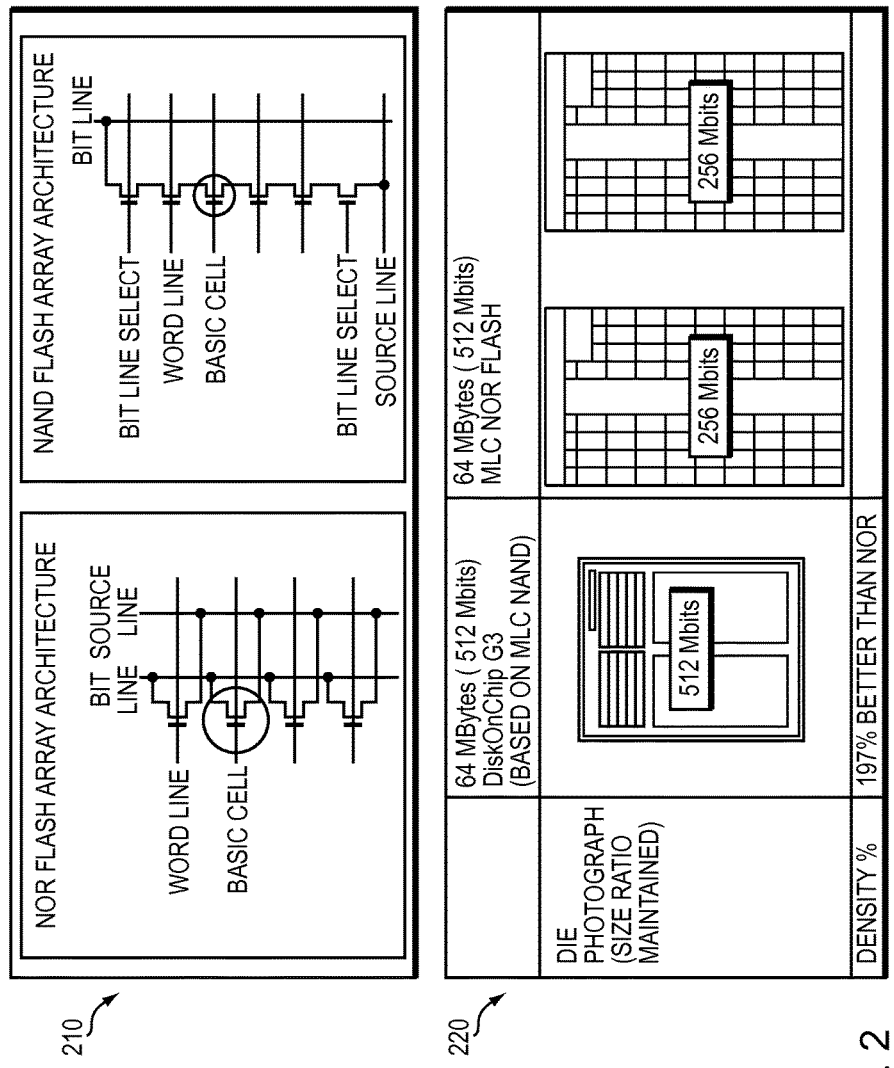
FIG. 2 is a simplified illustration of NOR and NAND interconnections and an example comparison of NAND and NOR chip size, in accordance with an embodiment of the present invention.

Generally, NAND flash memory cells are arranged in strings of transistors with the unselected transistors in bypass mode to allow access to memory cells further down the string. This arrangement yields further space saving but adds to the overhead of reading and writing. Refer now to the example embodiment of FIG. 2. In the example embodiment of FIG. 2, NOR flash 210 requires more interconnections and circuitry to manage the interconnection. Consequently NOR Flash takes up a larger area on the silicon die. NAND and NOR flash sizes are contrasted in Chip display 220.

Usually, NOR and NAND FLASH are considered different technologies. Conventionally, the common element between NAND and NOR Flash is that they both store electrons on an insulated structure in silicon. Generally, the arrangement of the cells, access methods, reading, writing and erase methods are different. Consequently, typical failure mechanism and life expectancy are diverse. Usually, the architecture of the host machines must be tailored to each technology and they can not share a memory space. Typically, the firmware used in the host to make the memory available to the system are substantially dissimilar in that for NAND there are extra algorithms required to accommodate the sequential nature of the data. Generally, the optimization of NAND and NOR Flash requires the application of different techniques to optimize different Flash settings.

NAND Memory Variables

Figure 3:
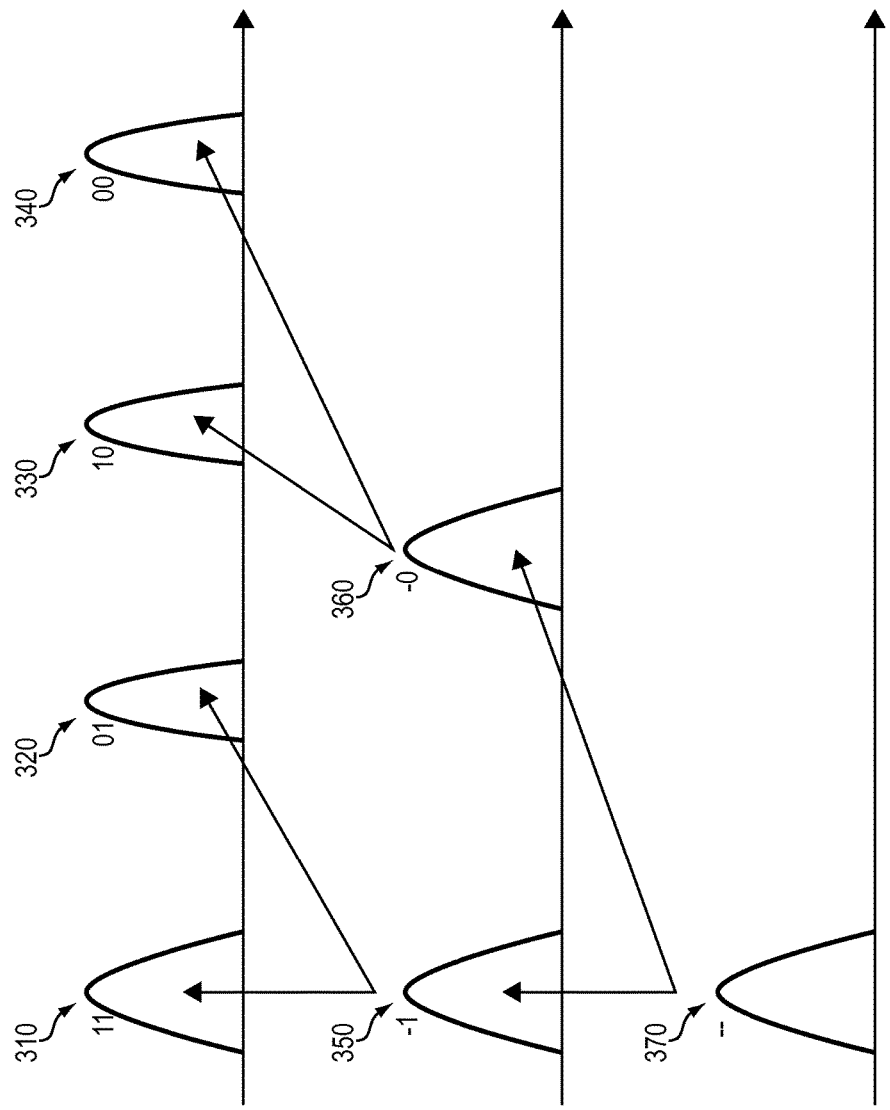
FIG. 3 illustrates an embodiment of a 2 bit per cell programming operation in MLC NAND, in accordance with an embodiment of the present invention.

Generally, a NAND chip may have a number of internal registers that may be used to control how data is written, erased and read. Refer now to the example embodiments of FIG. 3. In the embodiment of FIG. 3, two bits may be written to each memory cell during the MLC Flash programming operation. FIG. 3 illustrates how the memory cell may be programmed from its erased state to one of the final 4 possible states (11) 310, (01) 320, (10) 330, (00) 340. The threshold voltage (Vt) of the Flash memory cells is on the x-axis. The number of cells is on the y-axis. This Vt distribution is the common method of displaying the threshold voltage of all the cells in a Flash memory chip. The cell may start in erased state (11) 370. The cell may be programmed to 1 of 4 possible states, 310, 320, 330, and 340 as (11), (01), (10) or (00), respectively.

In the example embodiment of FIG. 3, a particular embodiment of changing the state of NAND Flash is shown. In the embodiment of FIG. 3, to get to the final state of 11, the memory cell may first have its least significant bit (LSB) programmed—as illustrated in 350. Then, most significant bit (MSB) 360 may be programmed to get to state 310. In the embodiment of FIG. 3, the Gaussian like distributions represent the threshold voltages of the various memory cells within a Flash memory device that have been programmed to the different levels—i.e. some cells may be in (11) state, some in (01) state, some in (10) state & others in (00) state.

Figure 4:
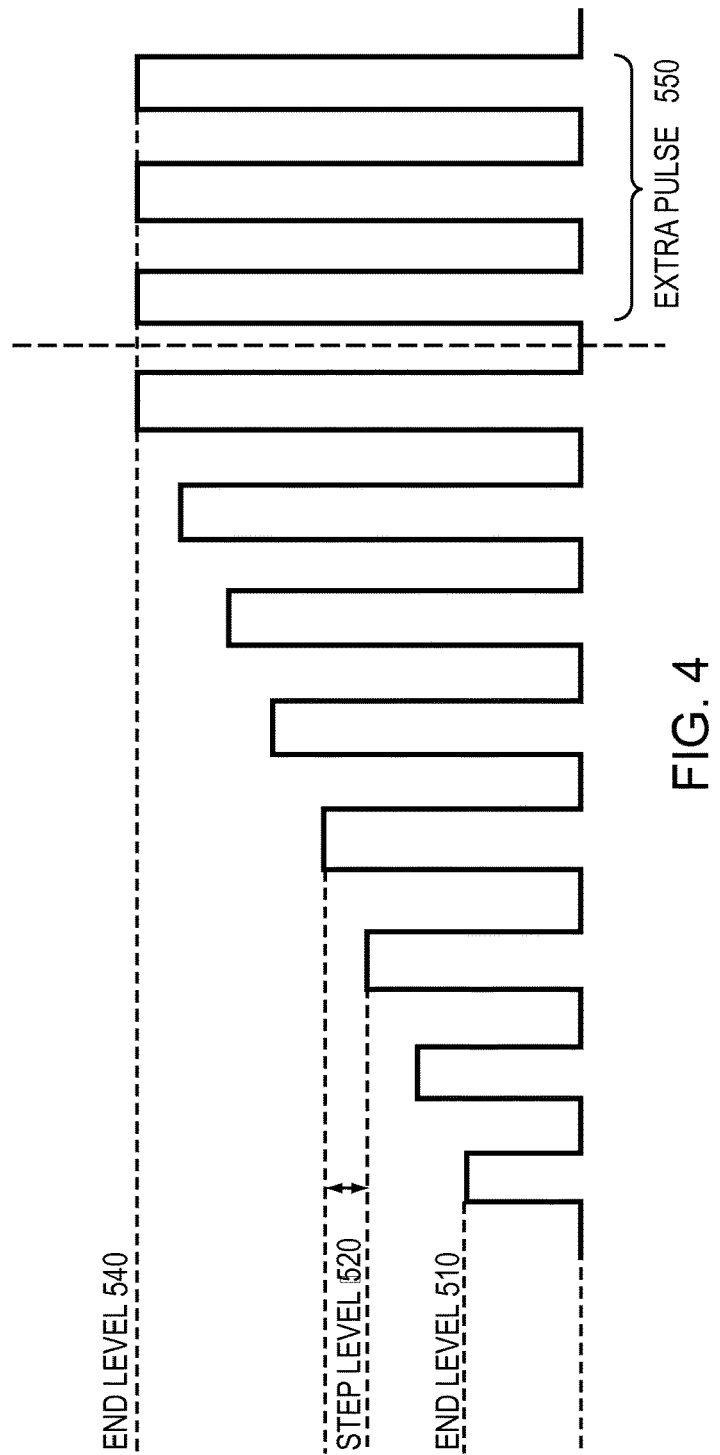
FIG. 4 is a simplified illustration of how different NAND levels can be programmed using an incremental step pulse programming process during the MLC Flash programming operation, in accordance with an embodiment of the present invention.

Refer now to the example embodiment of FIG. 4. The embodiment of FIG. 4 illustrates the programming operations that move the threshold voltage from the erased state to the LSB state & then the MSB states as is typically performed in a series of steps. In FIG. 4, an initial pulse is applied; and an additional pulse may have to be applied if this is lower than a predefined level. This process repeats until the cells threshold voltage (Vt) is greater than the predefined value (which is typically called the program verify level for that particular level). This process is sometimes referred to as the incremental step pulse programming process. The parameters (initial pulse level, pulse step level, end level, etc) may be determined by the values in their internal registers.

A NAND chip may have any number of parameters to be optimized. In some embodiments, this number could range typically from 14 to 30 parameters. For example, 14 parameters would lead to a search space of 4,398,046,511,104 different combinations of parameter settings. As well, some parameters may be dependant on or influence other parameters, creating more complexity in any optimization routine.

Optimization

In at least one embodiment, the current disclosure enables optimization of NAND Flash to increase endurance and/or retention. In some embodiments of the current disclosure, a Genetic Algorithm (GA) may be used to automatically generate an optimal or near optimal set of parameters (i.e. internal register settings) for a NAND Flash device. In other embodiments, the current techniques may enable automatically generating a set of parameters to maximize the endurance of NAND Flash. In some embodiments, the current techniques may enable automatically tuning the set of parameters for a particular usage profile, e.g. X endurance cycles with Y months retention. In other alternative embodiments, the current techniques may enable incorporation of domain specific knowledge (i.e. knowledge of NAND Flash physics) to restrict the search space in a structured way. In further embodiments, the current techniques may enable testing GA individuals using the actual silicon being optimized, which may be referred to herein as embodied testing.

In some embodiments, the current techniques may enable use of a combination of embodied testing, i.e. physical, and mathematical model building to exhaustively test the constrained parameter space in software. In these embodiments, the mathematical model relates how the inputs (i.e. the Flash's internal register values) can be mapped onto an output (i.e. the number of errors). In certain embodiments, the current techniques may enable continuously refining the models by testing individuals highlighted by the model as being the best performers, and then feeding their embodied scores back into the model builder. In at least some embodiments, the current techniques may enable performing multiple criteria evolution by performing measurements of certain characteristics of the chips, such as erase or program timings, which can only be performed in real hardware while the chip is operating. In further embodiments, the current disclosure may enable understanding of the variation in parameter settings of shipped parts, and be able to describe the optimal set in terms of what needs to be changed, for either absolute or relative values.

In some embodiments, further parameters, such as those associated with the programming operation (such as start voltage level, voltage step level, end level, number of possible steps, voltage increment, program verify levels, etc) may also be optimized by the genetic algorithm. In these embodiments, the Genetic Algorithm may optimize these programming parameters as well as the internal parameters associated with the read & erase operations. In some embodiments, changing these parameters—typically called the test mode parameters—may have the effect of changing the Vt distributions in FIG. 5 and consequently changing the performance & reliability of the Flash chips. Thus, in these embodiments, the genetic algorithm may account for such changes.

In other embodiments, the genetic algorithm may change the erase and read test parameters. In certain embodiments, the Erase operation is similar to the program operation in that it consists of a series of increasing voltage pulses. In some embodiments, the erase test mode parameters are very similar i.e. start voltage level, voltage step level, end level, number of steps).

Figure 5:
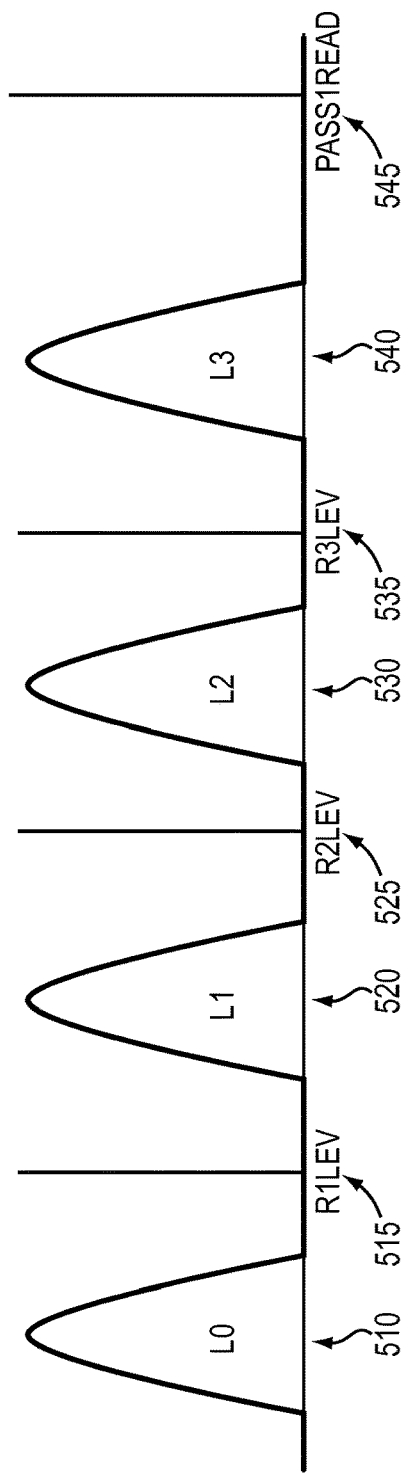
FIG. 5 is a simplified illustration of the Vt distributions of an MLC Flash chip, in accordance with an embodiment of the present invention.

In at least some embodiments, the read operation may be performed by determining which 'band' the threshold voltage of that memory cell resides i.e. referring to FIG. 5, if its threshold voltage is lower than R1LEV 515, then it is determined to be L0 level; if the cells threshold voltage is within the band R2LEV 525-R1LEV535, then it is determined to be L2. In FIG. 5, vertical lines 515, 525, 535, 545 are the boundaries for each band. FIG. 5 illustrates the 4 Vt distributions (L0 510, L1 520, L2 530 and L3 540) comfortably lie within their desired bands/boundaries. Generally, as a Flash chip is used, the distributions may start moving & possibly broaden out. Typically, an error is encountered when any part of the distribution moves beyond its boundary/band. Conventionally, the more the value moves out of its band, the more errors there are in the Flash.

In FIG. 5, the value of test mode parameters may dictate the Vt distributions i.e. their shape; how wide they are etc. Generally, when optimizing a Flash chip, the test mode registers or parameters may control the Vt distributions L0 510, L1 520, L2 530 and L3 540. Typically these parameters may also control where the boundary location of the bands may be i.e. vertical lines 515, 525, 535, 545 in FIG. 5. In other embodiments, the test mode parameters that may be changed/optimized by the Genetic Algorithm are those parameters associated with programming, erasing & reading. In some embodiments, the genetic algorithm may change the erase: start voltage level, voltage step level, end level, number of possible steps, voltage increment, erase verify level. In some embodiments, the genetic algorithm may change the read, R1Lev, R2Lev, R3Lev.

In some embodiments, optimization may occur through the use of hardware and software. In certain embodiments, the hardware may be used to test the parameter sets or recipes generated by the software. In at least one embodiment, there may be three levels of testing. In further embodiments, the genetic algorithm may be used to search the parameter space creating test parameters. In at least some embodiments, the use of additional mathematical models may be used to prune the search space during the search process. In certain embodiments, evaluation of new parameter sets (recipes) may be performed using software and hardware which tests the Flash under various levels of accelerated conditions. In at least some embodiments, the hardware testing may be in two phases, an accelerated endurance test and a less severe test, which may be more accurate, for endurance and retention. In some embodiments, the tests may be performed under various environmental conditions to simulate the passage of time or enhance certain physical phenomena such as charge detrapping in the Flash memory cells.

In certain embodiments, a rapidly accelerated test may discover potential solutions; and these potential solutions may be put through a slower but more accurate endurance/retention evaluation. In some embodiments, the accelerated test may be used to quickly measure the quality of a recipe or parameter set by wearing out a block of NAND Flash as quickly as possible using the parameters. In some embodiments, a typical target endurance may be much higher than the initial starting endurance value. For example, a typical target endurance value could be 45,000 p/e cycles while the starting endurance value could be 5,000 p/e cycles. In some embodiments, an accelerated test may take around one hour and forty-five minutes to conduct 45,000 p/e cycles, which is about 7.5 p/e cycles per second. In some embodiments, there may be no recovery time between cycles, and the cycling may be conducted at room temperature.

In further embodiments, a week long endurance and retention test may take a week to wear out a block using a particular recipe. In certain embodiments, this may equate to about 0.075 p/e cycles per second, which gives approximately 13.4 seconds recovery time between cycles on a particular block. In other embodiments, the pattern used for wear may be a randomly generated pattern, which may be less stressful than a pattern of all zeroes.

In certain embodiments, the accelerated test may be beneficial for comparing new recipes. In other embodiments, a week long, or even longer, test may analyze what happens to devices throughout and at the end of their life. In at least some embodiments, it may be possible to run up to 270 week long hardware tests in parallel. In further embodiments, the rate of recipe evaluation may be increased by running even more tests in parallel.

Hardware

In some embodiments, the solutions generated by the GA may be tested in hardware. In some embodiments, the hardware used to test solutions may have two components, a high temperature hardware interface with embedded single board computer (SBC), and a control and data handling application, referenced herein for simplicity as Flashprobe. In certain embodiments, a piece of software, called Flashclient herein for simplicity, may manage and maintain data generated by multiple instances of the Flashprobe hardware and so the system is parallel.

In further embodiments, the Flashprobe hardware may put the NAND devices in to any mode of operation, such as factory mode and various test modes. In some embodiments, certain modes may be special modes for interacting with registers and are required for downloading parameter sets. In alternative embodiments, the hardware may be able to read, write and erase the various pages and blocks. In at least one embodiment, the hardware may accurately measure interface activity times to measure the timing of operations such as read, write and erase. In most embodiments, the hardware tester platform may be matched to an environmental oven which can manage multiple NAND tests. In some embodiments, the oven is ported to allow power and data cable access and may be able to bring the hardware to 125 C during operations.

Figure 6:
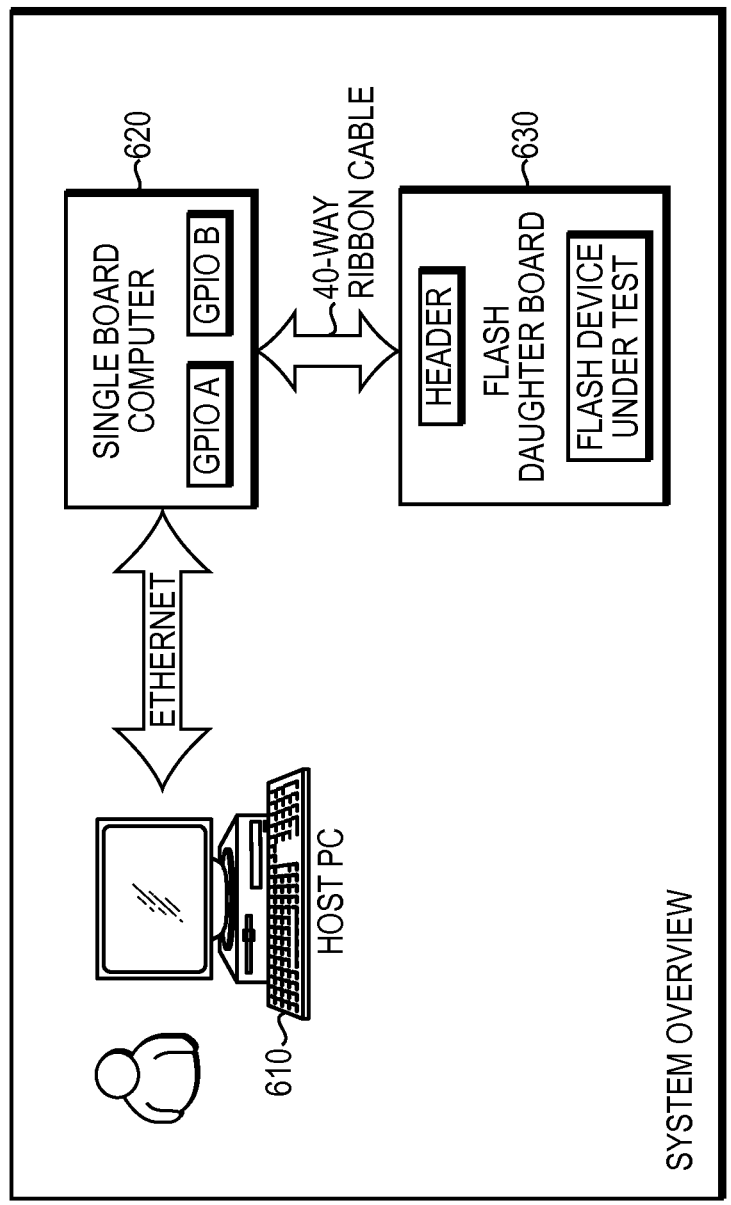
FIG. 6 is a simplified illustration of a sample hardware set-up for testing the parameter settings, in accordance with an embodiment of the present invention.

Refer now to the example embodiment of FIG. 6, which illustrates a sample hardware set-up for testing the parameter settings. In the embodiment of FIG. 6, the Flashclient 610 operates in cooperation with Flashprobe 630, a high temperature hardware interface with embedded single board computer (SBC) 620.

Figure 7:
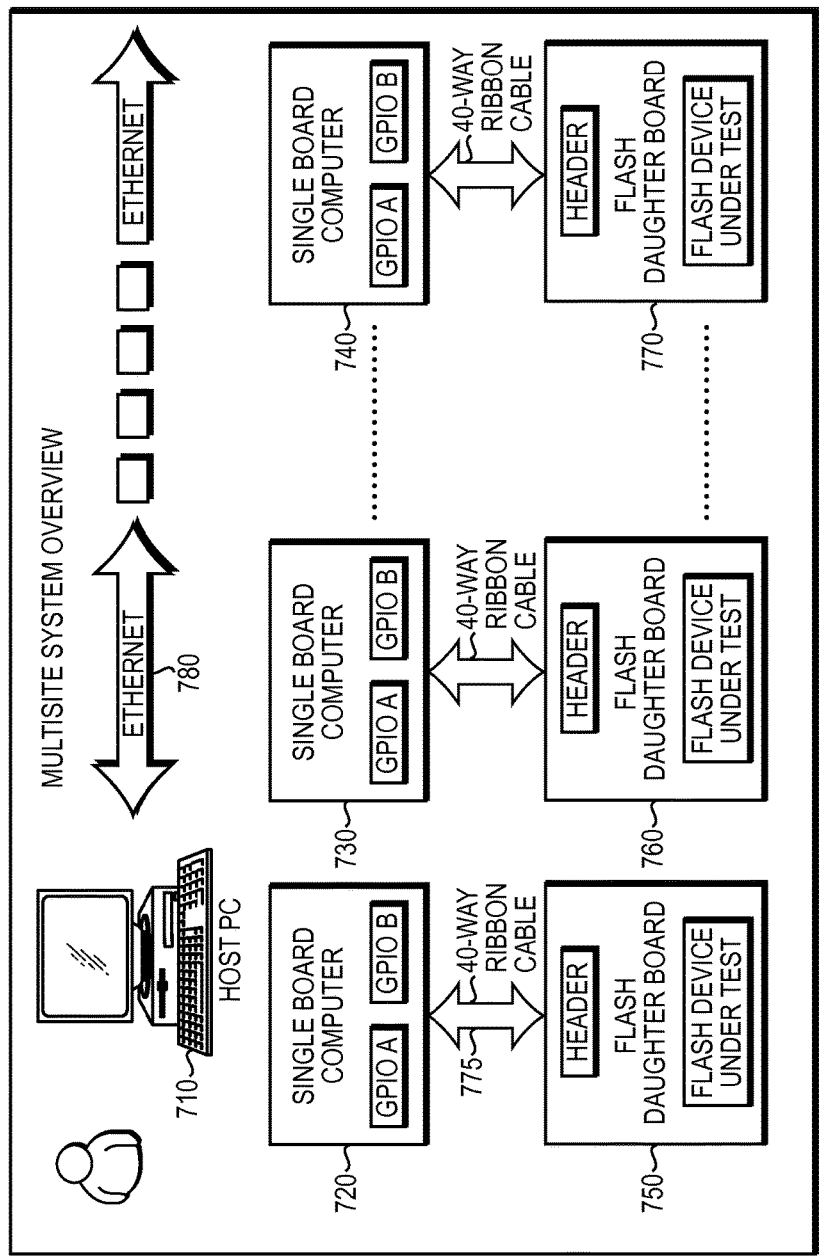
FIG. 7 is a simplified illustration of firmware to manage and maintain data generated by multiple instances of the hardware tests of the NAND Flash, in accordance with an embodiment of the present invention.

Refer now to the example embodiment of FIG. 7. In the example embodiment of FIG. 7, Flashclient 710 may manage and maintain data generated by multiple instances of the Flashprobe hardware, 750, 760, and 770 to run tests in parallel. In FIG. 7, SBCs boards, such as SBC board 720, comprises a high temperature adaptor board with the SBC running a complex hardware interface program, Flashprobe 750.

In this embodiment, Flashprobe 740 can put the NAND devices in to any mode of operation, such as factory mode and various test modes, and can read, write and erase the various pages and blocks.

In FIG. 7, SBC is connected via a ribbon cable 775 to daughter card 750 carrying the test head and the flash part. Tester is connected via Ethernet 780 to a host PC 710 running the software application "FlashClient." In further embodiments, this multi-site system may be coupled with an environmental oven capable of bringing the test head to 125 C. In some embodiments, the oven may be ported to allow precise temperature measurement and to allow power and communications cable access.

In this embodiment, the Flashprobe hardware is capable of measuring Endurance, Retention and Flash chip timings. The hardware may also provide feedback to the GA by improving the parameters which control the operation of the device and writing those improved values or recipes back to standard chips. The hardware may prove that these new recipes work as intended by testing the device with these new parameter set. The hardware of FIG. 7 may measure the time it takes for the devices to return from an operation. This measurement may be useful for measuring programming activity timing such as erase, read and write time.

The Flashprobe hardware may be capable of running a set of timing and retention tests. The Flashclient may be able to simulate different storage conditions, such as the passage of time, by varying environmental conditions such as time & temperature. In most embodiments, the equivalent of a given wait time at normal operating temperatures may be calculated using the Arrhenius equation. For example, a wait time of 3 months under room temperature conditions may be equivalent to a wait of 13 hours at 85 C for certain activation energies.

Software

In some embodiments, the hardware may operate in conjunction with software. In certain embodiments the software may generate test mode parameters or NAND Flash settings to be tested by the hardware. In further embodiments, the software may have three components, a Flashclient, which may communicate with the hardware to test the sample parameters, a genetic algorithm (GA), which may search the parameter space of NAND Flash settings and may optimize the settings, and a Modeler (a mathematical model), which may be used to prune the search space.

Flashclient

In some embodiments, the hardware may be directed by a software program. In certain embodiments, software called FlashClient may manage all testers and testing. In at least some embodiments, the Flashclient may operate the testing hardware and may operate tests in parallel. In these embodiments, the parallel operation may enable multiple tests to be evaluated in a single run. In most embodiments, the Flashclient may be enabled to manage multiple number of testers, maintain data files on every device ever used on the test platform, maintains records on all tests run on the platform, operate multiple modes to drive silicon through various stages of endurance and retention testing, import and export device files, read and import parameter or recipe file which have been constructed by the GA and modeler, issue recipe testing instructions to any hardware interface, number and track individual silicon chips, manage memory of the Flash, calculate ECC bit error rates from data, and synopsizing the data stream for ease of reporting.

Figure 8:
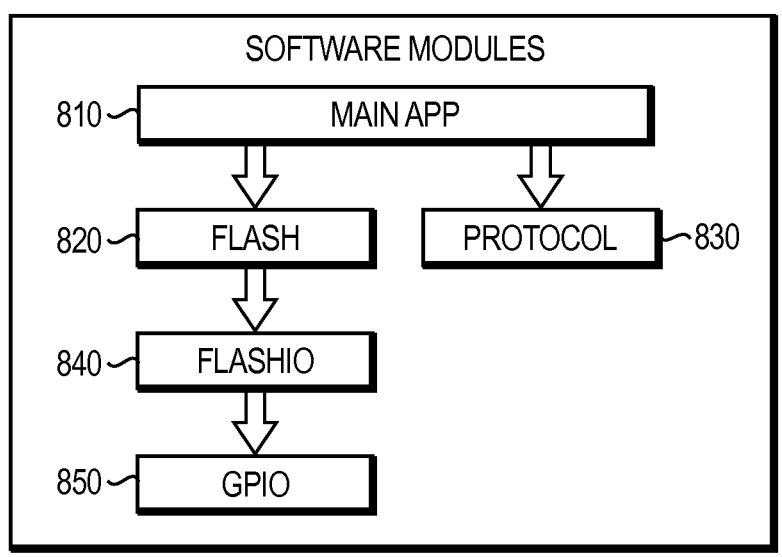
FIG. 8 is a simplified illustration of software sub-modules of testing software, in accordance with an embodiment of the present invention.

Refer to the sample embodiment of FIG. 8. In this exemplary embodiment, the Flashclient may have sub modules. In an embodiment, the Flashclient may have a GPIO 850 module, a FlashIO module 840, and a Flash module 820 and a protocol. GPIO module 850 may encapsulate hardware accesses to the GPIO pins. The GPIO module may enable functions to get and set an entire register, get and set a bit within a register, change the sign of one or more bits in a register and finally to get and set a string of bytes (used for page read and page program operations). FlashIO module 840 may encapsulate operations specific to NAND flash such as column and row address latching and page read and write operations.

Flash operations module 820 adds a level of functionality over the FlashIO module 840. It maintains a structure of information associated with a flash device such as bad block map, block erase counters, etc. The bad block map is a list of bad blocks that are discovered at first initialization to prevent the software having to scan the entire device for bad blocks on every power up. It stores this structure in block 0 of the flash device and the structure begins with a unique 32-byte identifier. Block 0 is used since this block is guaranteed by the manufacturer to not initially be a bad block. On MLC devices this system is updated to use disk files for permanent storage instead of block 0 of the device.

In certain embodiments, FlashClient may manage this data for MLC devices and writes a unique identifier to the devices to pair it with its data file. In some embodiments, this identity is heavily error corrected on reading. In at least some embodiments, this may mean that MLC devices has device files imported to the test environment while SLC devices do not. FlashClient provides a mechanism for importing and exporting device files. In alternative embodiments, similar to the bad block map, an erase/program error map is also created which is updated during run-time with the number of p/e cycles completed the number of errors reported by the chip etc.

Genetic Algorithm (GA)

In certain embodiments, the hardware may test parameter solutions provided by a GA. Typically, a Genetic Algorithm is a population based computation search and optimization method, coarsely based on the processes of natural selection and genetics. Generally, GAs maintain populations of individuals and an individual is a potential solution to the problem. Usually, the GA operates by recombining the better individuals with each other, so that, on average, the population continually improves.

Generally, an individual encodes the parameter set for a problem solution, often as a binary string. Conventionally, GAs combine the idea of survival of the fittest with a structured yet randomized information exchange to form a search algorithm that make use of historical information and speculate on new search points with expected improvements in performance. Generally, GAs are a population based search algorithm and rely on being able to get feedback in the form of a fitness function or fitness value that indicates how good or bad the individuals in the current population are at solving the problem defined. GAs typically begin with a population of random chromosomes or individuals, each of which represents a solution to the search problem. Usually, each chromosome is a string of 1's and 0's.

Usually, each chromosome, when combined with other similar 'fit' genetic code potentially creates better solutions in subsequent generations. Typically, individuals are chosen for recombination in a probabilistic manner, with the more fit individuals being more likely to be chosen. Conventionally, chromosomes are modified by crossover or mutation.

Figure 9:
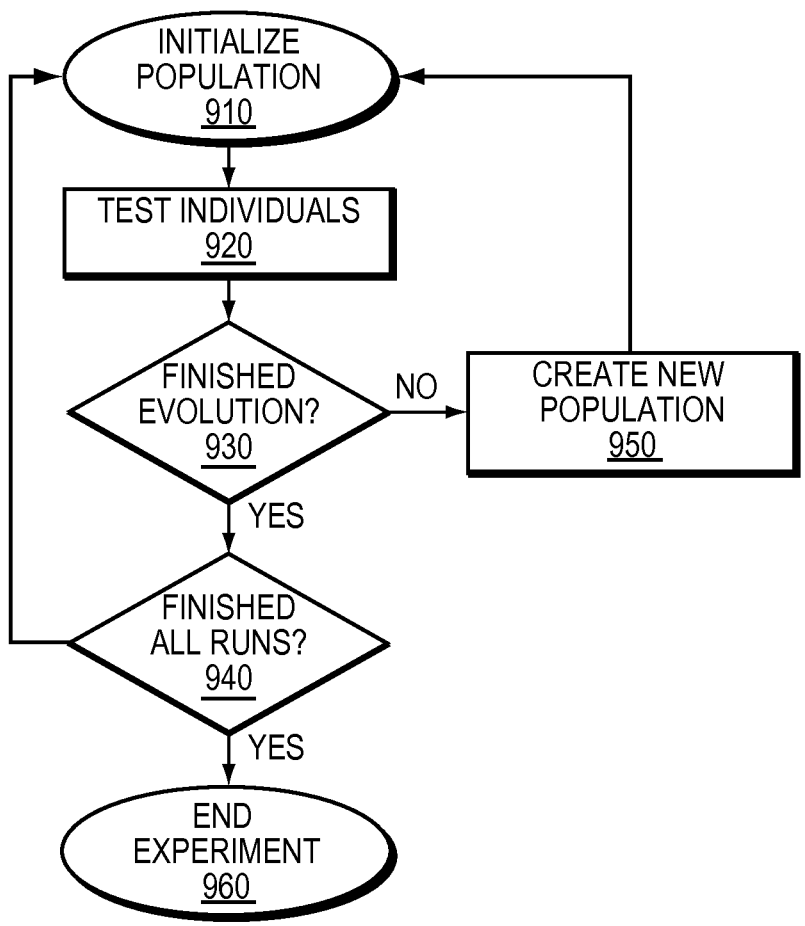
FIG. 9 is a simplified illustration of method of running a Genetic Algorithm, in accordance with an embodiment of the present invention.

Generally, a GA may function by 1) initializing a population 2) testing the population 3) determining the best individuals in the population, 4) creating a new population based on the best individuals, and 5) repeating steps 2-4 until a stopping criteria is reached. Refer now to the example embodiment of FIG. 9. In FIG. 9, a population is initialized (step 910). Individuals are tested (step 920). It is checked if the evolution is finished (step 1030). If the evolution is not finished, a new population is created (step 950). If the evolution is finished and all the runs are not complete, a new population is initialized (step 910). If all runs are finished, the experiment is ended (step 960).

Figure 10:
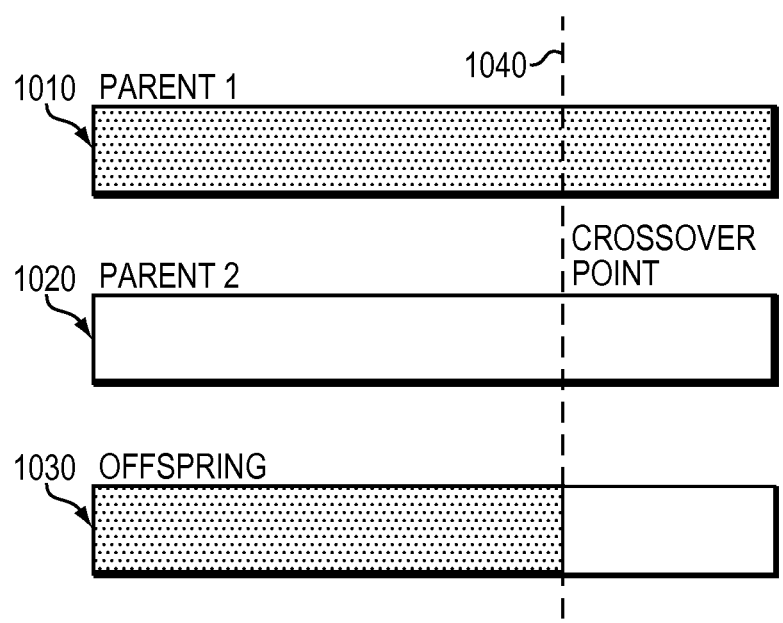
FIG. 10 is a simplified illustration of crossover, in accordance with an embodiment of the present invention.

Refer now to the sample embodiment of FIG. 10, which illustrates a sample crossover. In the sample embodiment of FIG. 10, a piece of chromosome 1010 is taken and a piece of chromosome 1020 is taken along split point 1040 and the pieces of the parents, 1010, 1020 are combined to make an offspring chromosome 1030. Generally, crossover may be as illustrated in FIG. 10, have different crossover points, or take any portion of either parent for the recombination. If the chromosome is not a bit string, a cross over function may need to be specifically created for the chromosome.

Figure 11:
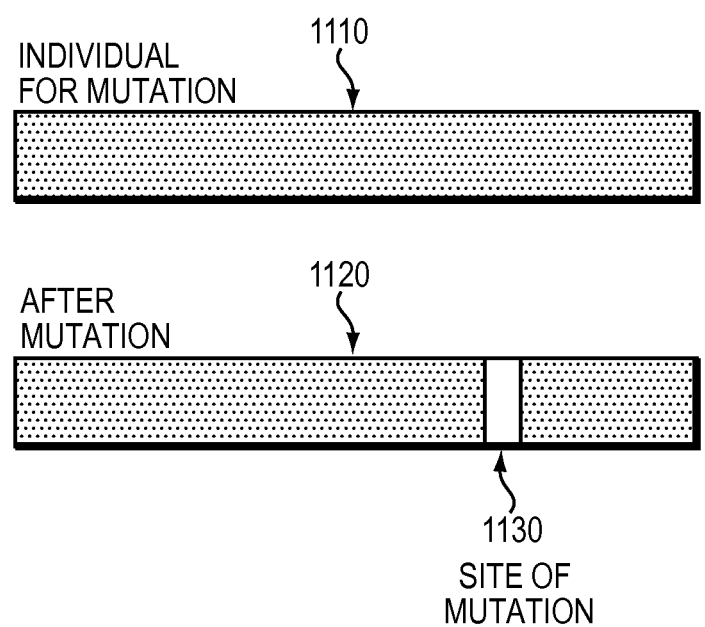
FIG. 11 is a simplified illustration of mutation, in accordance with an embodiment of the present invention.

Refer now to the example embodiment of FIG. 11. FIG. 11 illustrates an example embodiment of mutation, where individual 1110 has a portion of the chromosome, 1130, changed to make mutated chromosome 1120. Generally, the chromosomes are made up of strings of bits so a mutation may be performed by flipping the mutated bits. Usually, the mutation can occur in any portion of the chromosome. If the chromosome is not a bit string, a mutation function may need to be specifically created for the chromosome.

Usually, over iterations, the population as a whole evolves, until a stopping criterion is reached. Conventionally, the stopping criteria is usually either the appearance of an individual with a particular fitness or when the population has converged, meaning that most individuals in the population are either identical or near-identical.

In some embodiments of the current disclosure, the chromosome may be indirectly mapped to the control registers of the NAND flash memory chip. In these embodiments, the chromosomes may be evaluated in terms of it fitness (quality of solution) and is allowed to reproduce in such a way that the fitter the chromosome (i.e. the better the solution), the greater the probability of it reproducing with others in the population. In certain embodiments, this may have the effect of maintaining its genetic material in the gene pool.

Refer now to FIG. 12. In the embodiment illustrated in FIG. 12, the variables to be optimized for Flash memory may be determined (step 1210). In most embodiments, these variables may be any register set or parameters associated with the NAND Flash.

An object with the parameters to be optimized may be created (step 1220). In some embodiments, this may be the mapping of the selected parameters to a bit stream. A genetic algorithm to mate or optimize the created objects may be created (step 1230). In certain embodiments, the genetic algorithm may define the cross-over and mutation functions as well as functions for defining a new population and evaluating individuals in terms of the fitness for each individual.

In some embodiments, the GA is capable of exploiting the relationships identified between the parameters. In certain embodiments, this is possible because the initial population is made up only of individuals that satisfy all the constraints; newly created individuals are only tested if they too, satisfy the constraints. In some embodiments, the results of the GA are a selection of individuals that may be categorized into three groups:

Type 0: Individuals that fail to reach a certain number of cycles, for example 45,000 cycles.

Type 1: Individuals that reach 45,000 cycles, but that have so many errors (several thousand) that they may almost certainly fail a retention test.

Type 2: Individuals that reach 45,000 cycles and have few enough errors that they may pass a retention test. The threshold between Type 1 and Type 2 is 1000 errors at 45,000 cycles. In most embodiments, this threshold may be a function of test conditions e.g. how much of an accelerated test & what test pattern.

Figure 13:
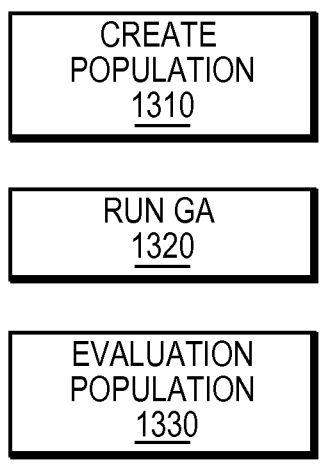
FIG. 13 is a simplified illustration of a method of optimizing NAND variables with a Genetic Algorithm, in accordance with an embodiment of the present invention.

Refer now to the sample embodiment of FIG. 13. In the example embodiment of FIG. 13 a population of individuals may be created (step 1310). A GA may be run with the population (step 1430). The population may be evaluated (step 1330).

Modeling Software

In some embodiments, after each GA run (which may typically consists of tens to hundreds of individuals), the individuals may be run on modeling software, which may evaluate how the various register values may be used to predict the number of errors. In certain embodiments, this model may be used to perform a coarse grained enumerated search through the individuals to identify which parameter sets were likely to yield the fewest errors, based on the types of individuals. In at least some embodiments, these sets may be used to seed the next GA run. In further embodiments, this process may occur iteratively and the quality of the results may be improved with each GA run, as more and more data is available.

Testing

In further embodiments, the GA, hardware, and modeling software may be combined with accelerated endurance and retention tests. Following the application of these tests, it may be determined which parameter set or recipe performed best in NAND Flash. These best performing parameter sets may then be used to increase the performance of the NAND Flash.

In some embodiments, the retention test may be performed after a p/e cycling test is performed, such as an endurance test. In certain embodiments, the result from the retention test may be influenced by the severity of any endurance test already performed. In further embodiments, the severity of endurance test may correlate to the rate of endurance acceleration with the greater the rate of acceleration (i.e. lower test time) resulting in more degradation & consequently worse retention.

In certain embodiments, an accelerated test may be used to measure the quality of a recipe by wearing out a block as quickly as possible using its parameters. In some embodiments, an accelerated test takes approximately one hour and forty-five minutes to conduct 45,000 p/e cycles, which is about 7.5 p/e cycles per second. There is no recovery time between cycles, and the cycling is conducted at room temperature.

Figure 14:
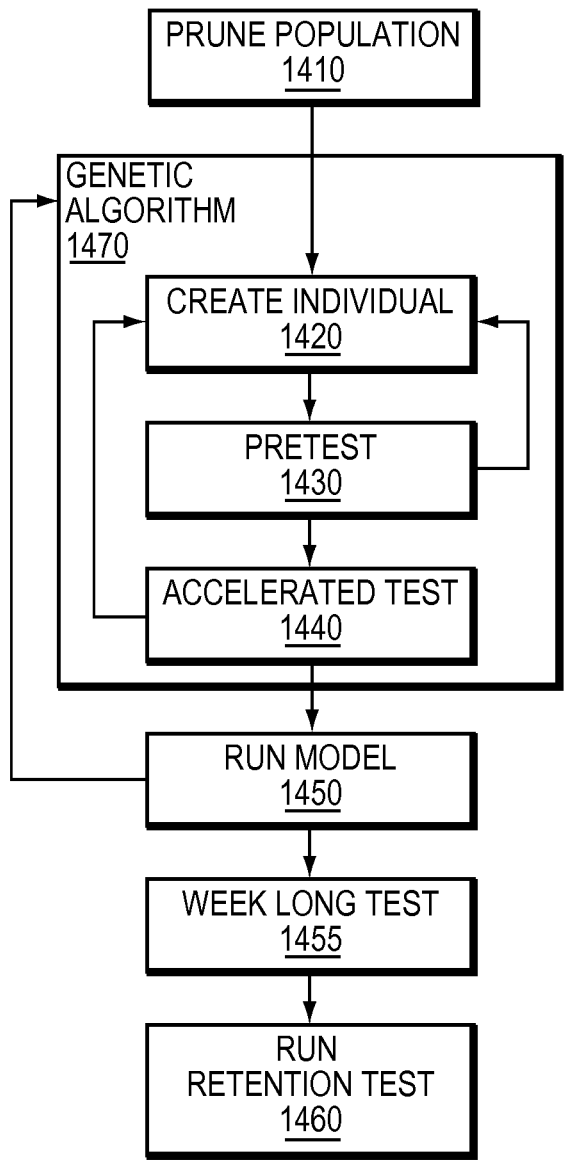
FIG. 14 is a simplified illustration of an alternative method of optimizing NAND variables with a Genetic Algorithm, in accordance with an embodiment of the present invention.

Refer now to the example embodiment of FIG. 14 which illustrates how the GA, the modeler and the Flashclient may be used to optimize NAND Flash settings. The example embodiment of FIG. 14 illustrates a method that may be applied to optimize flash memory. The population may be pruned (step 1410). The individuals may be created (step 1420). The individuals may be pre-tested (step 1430). If the individuals pass the pre-test, a full test may be run on the individual (step 1440). The model may be run (step 1450). A week long test may be run (step 1455). A retention test may be run (step 1460). Retention test 1460 may include loading the result parameters from the GA into hardware chips to determine how the parameter settings impact actual device performance.

In some embodiments, the pruning process may reduce the number of parameters to be varied. In certain embodiments, the reduction may be performed by analyzing the physics of operation. In most embodiments, after a pruning, there may be a large search space remaining. In at least some embodiments, the pre-test may take about 1 minute and may identify recipes that are likely to fail i.e. the test may screen out the worse case parameter sets (or recipes).

Figure 15:
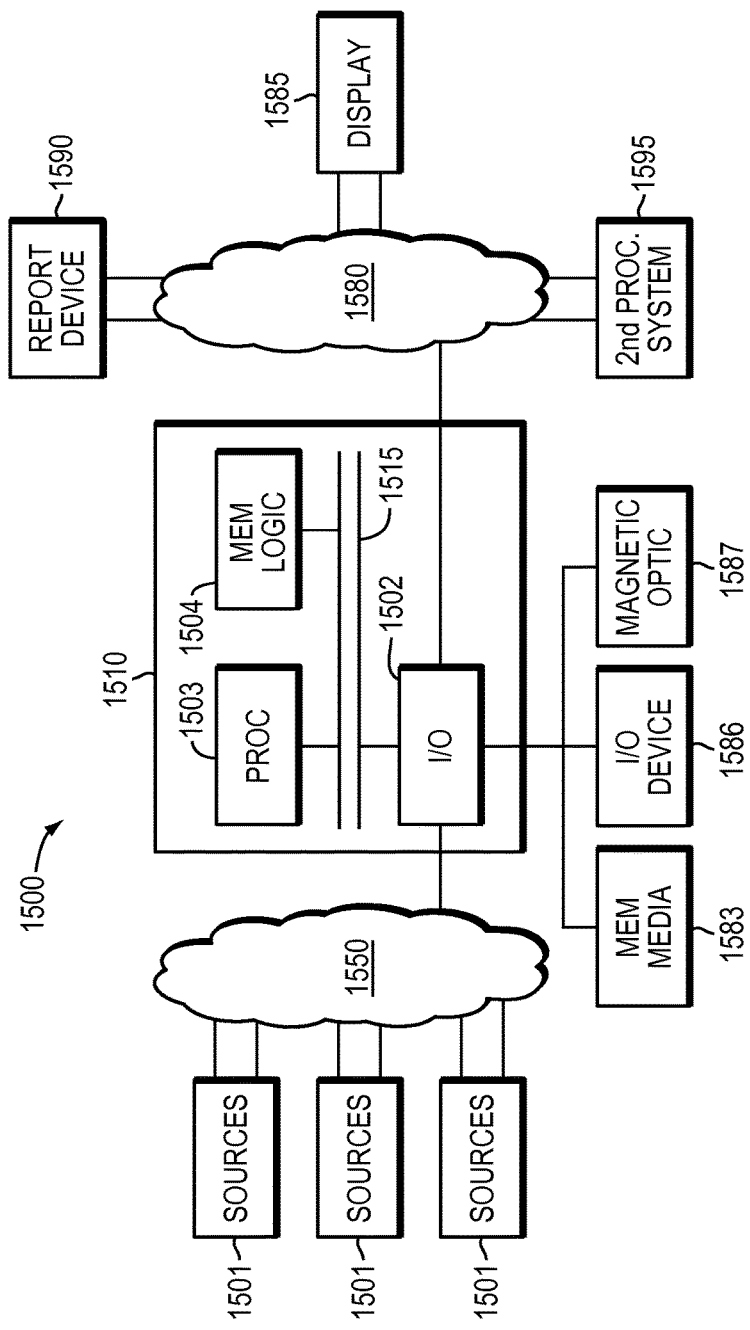
FIG. 15 is an example of an embodiment of an apparatus that may utilize the techniques described herein.
Figure 16:
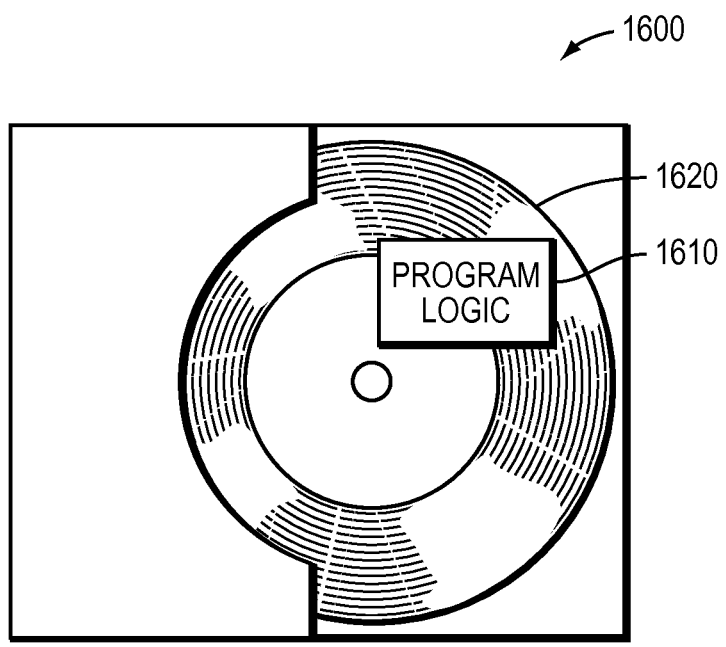
FIG. 16 is an example of an embodiment of a method embodied on a computer readable storage medium that may utilize the techniques described herein.

In some embodiments, the accelerated test and the week-long test may p/e cycle the Flash blocks up to target values of 45,000 cycles. As used herein, the p/e cycling may be referred to as endurance testing. In certain embodiments, the accelerated test may not be as accurate as a week long endurance test, due to the speed of the accelerated endurance test. In these embodiments, the week long endurance test may be more accurate and may be used to test the most highly rated recipes. In most embodiments, the recipes which have been identified as possible solutions by the week long endurance test may proceed to the retention test. In at least some embodiments, the retention test may degrade performance of the Flash as it is moves the Vt distributions of the Flash cells. In these embodiments, if the Vt distributions move outside their boundaries, as defined by R1LEV, R2LEV, R3LEV, i.e. such as in FIG. 5, then an error may result The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium. When the program code is loaded into and executed by a machine, such as the computer of FIG. 15, the machine becomes an apparatus for practicing the invention. When implemented on one or more general-purpose processors, the program code combines with such a processor to provide a unique apparatus that operates analogously to specific logic circuits. As such a general purpose digital machine can be transformed into a special purpose digital machine. FIG. 16 shows Program Logic 1610 embodied on a computer-readable medium 1630 as shown, and wherein the Logic is encoded in computer-executable code configured for carrying out the process of this invention and thereby forming a Computer Program Product 1600.

The logic for carrying out the method may be embodied as part of the aforementioned system, which is useful for carrying out a method described with reference to embodiments shown in, for example, FIG. 13 and FIG. 14. For purposes of illustrating the present invention, the invention is described as embodied in a specific configuration and using special logical arrangements, but one skilled in the art will appreciate that the device is not limited to the specific configuration but rather only by the claims included with this specification.

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

In reading the above description, persons skilled in the art will realize that there are many apparent variations that can be applied to the methods and systems described.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. A computer implemented method for increasing the life of a NAND flash, the method comprising:
   selecting a set of internal control parameters for the NAND flash;
   mapping the set of internal control parameters to a bit stream; and
   optimizing the set of internal control parameters with a genetic algorithm to find an improved set of control parameters, wherein the optimizing affects the threshold voltage distribution of at least one memory cell in the NAND flash, wherein the improved set of internal control parameters are run iteratively through a software model and the genetic algorithm until a stopping criteria is met, wherein the software model evaluates how the improved set of control parameters predict a number of errors in the memory cells of the NAND flash.

2. The method of claim 1 further comprising:
   running the improved set of control parameters through an accelerated hardware test.

3. The method of claim 1 further comprising:
   pruning the set of internal control parameters through the use of a mathematical model.

4. The method of claim 1 further comprising:
   running the improved set of internal control parameters through a hardware test simulating constant usage of the parameters in a NAND Flash.

5. The method of claim 1 further comprising:
   loading the parameters into a set of hardware NAND flash; and
   running an endurance retention test on the set of parameters.

6. The method of claim 1 wherein the genetic algorithm optimizes parameter solutions by encoding parameter sets into members of a population, evaluates the members of the population, and selects the members of the population with best fitnesses.

7. The method of claim 6 wherein the genetic algorithm encodes variations of the members of the populations with the best fitness into a new population, evaluates the new population, and selects the members of the new population with the best fitness.

8. The method of claim 7 wherein the encoding of variations of the members of the populations include crossing the parameter set of members of the population with the parameter set of others of the population and mutating members of the population.

9. The method of claim 1 wherein the genetic algorithm runs several populations of parameters through the software model to determine a best performing set of parameter values.

10. A computer program product comprising:
    a non-transitory computer readable medium encoded with computer executable program code, the code:
    selecting a set of internal control parameters for a NAND flash;
    mapping the set of internal control parameters to a bit stream; and
    optimizing the set of internal control parameters with a genetic algorithm to find an improved set of control parameters, wherein the optimizing affects the threshold voltage distribution of at least one memory cell in the NAND flash, wherein the improved set of internal control parameters are run iteratively through a software model and the genetic algorithm until a stopping criteria is met, wherein the software model evaluates how the improved set of control parameters predict a number of errors in the memory cells of the NAND flash.

11. The computer program product of claim 10, wherein the code further enables:
running the improved set of control parameters through an accelerated hardware test.

12. The computer program product of claim 10, wherein the code further enables:
pruning the set of internal control parameters through the use of a mathematical model.

13. The computer program product of claim 10, wherein the code further enables:
running the improved set of internal control parameters through a hardware test simulating constant usage of the parameters in a NAND Flash.

14. The computer program product of claim 10, wherein the code further enables:
loading the parameters into a set of hardware NAND flash; and
running an endurance retention test on the set of parameters.

15. An apparatus for optimization of a NAND flash, the apparatus comprising:
computer-executable program code stored in memory of the device, wherein the computer-executable program code is configured for execution on one or more processors of the following:
selecting a set of internal control parameters for the NAND flash;
mapping the set of internal control parameters to a bit stream; and
optimizing the set of internal control parameters with a genetic algorithm to find an improved set of control parameters, wherein the optimizing affects the threshold voltage distribution of at least one memory cell in the NAND flash, wherein the improved set of internal control parameters are run iteratively through a software model and the genetic algorithm until a stopping criteria is met, wherein the software model evaluates how the improved set of control parameters predict a number of errors in the memory cells of the NAND flash.

16. The apparatus of claim 15, further comprising:
a hardware testing platform;
wherein the code further enables:
running the improved set of control parameters through an accelerated hardware test on the hardware testing platform.

17. The apparatus of claim 15, wherein the code further enables:
pruning the set of internal control parameters through the use of a mathematical model.

18. The apparatus of claim 15, further comprising:
a hardware testing platform;
wherein the code further enables:
running the improved set of internal control parameters through a hardware test simulating constant usage of the parameters in a NAND Flash with the hardware testing platform.

19. The apparatus of claim 15, further comprising:
a hardware testing platform;
wherein the code further enables:
loading the parameters into a set of hardware NAND flash; and
running an endurance retention test on the set of parameters.

* * * * *